United States Patent
Ogawa et al.

(10) Patent No.: US 10,460,963 B2
(45) Date of Patent: Oct. 29, 2019

(54) PLASMA PROCESSING METHOD

(71) Applicant: Tokyo Electron Limited, Tokyo (JP)

(72) Inventors: Shuhei Ogawa, Miyagi (JP); Wanjae Park, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/747,900

(22) PCT Filed: Aug. 10, 2016

(86) PCT No.: PCT/JP2016/073648
§ 371 (c)(1),
(2) Date: Jan. 26, 2018

(87) PCT Pub. No.: WO2017/033754
PCT Pub. Date: Mar. 2, 2017

(65) Prior Publication Data
US 2018/0226279 A1    Aug. 9, 2018

(30) Foreign Application Priority Data
Aug. 27, 2015 (JP) .................. 2015-167416

(51) Int. Cl.
*H01L 21/67* (2006.01)
*H01L 21/027* (2006.01)
(Continued)

(52) U.S. Cl.
CPC ........ *H01L 21/67069* (2013.01); *H01J 37/00* (2013.01); *H01L 21/0273* (2013.01);
(Continued)

(58) Field of Classification Search
None
See application file for complete search history.

(56) References Cited

U.S. PATENT DOCUMENTS

| | | | | |
|---|---|---|---|---|
| 2008/0220616 A1* | 9/2008 | Matsui | ............. | H01L 21/31133 438/736 |
| 2010/0224587 A1* | 9/2010 | Mukawa | .......... | H01J 37/32027 216/13 |
| 2015/0228497 A1* | 8/2015 | De Schepper | ...... | H01L 21/0273 438/694 |

FOREIGN PATENT DOCUMENTS

| | | |
|---|---|---|
| JP | 06-168918 A | 6/1994 |
| JP | 2000-221698 A | 8/2000 |

(Continued)

OTHER PUBLICATIONS

International Search Report for PCT/JP2016/073648 dated Sep. 20, 2016.

*Primary Examiner* — Jiong-Ping Lu
(74) *Attorney, Agent, or Firm* — Pearne & Gordon LLP

(57) ABSTRACT

A plasma processing method of processing a processing target object, in which an organic film, a mask film and a resist film are stacked in sequence, by plasma includes a process of supplying a modifying gas, which is a $H_2$ gas, a hydrogen halide gas, or a mixed gas containing a rare gas and a $H_2$ gas or a hydrogen halide gas, into a chamber accommodating therein the processing target object in which a preset pattern is formed on the resist film; and modifying process of modifying the resist film of the processing target object by plasma of the modifying gas at a processing temperature equal to or less than −20° C.

6 Claims, 13 Drawing Sheets

(51) Int. Cl.
  *H01L 21/768* (2006.01)
  *H01L 21/308* (2006.01)
  *H05H 1/46* (2006.01)
  *H01L 21/311* (2006.01)
  *H01J 37/00* (2006.01)

(52) U.S. Cl.
  CPC ........ *H01L 21/308* (2013.01); *H01L 21/3086* (2013.01); *H01L 21/31116* (2013.01); *H01L 21/31138* (2013.01); *H01L 21/31144* (2013.01); *H01L 21/76802* (2013.01); *H05H 1/46* (2013.01)

(56) References Cited

FOREIGN PATENT DOCUMENTS

| | | |
|---|---|---|
| JP | 2005-072518 A | 3/2005 |
| JP | 2005-243681 A | 9/2005 |
| JP | 2008-218959 A | 9/2008 |
| JP | 2009-267352 A | 11/2009 |
| JP | 2013-145874 A | 7/2013 |
| JP | 2014-082475 A | 5/2014 |

* cited by examiner

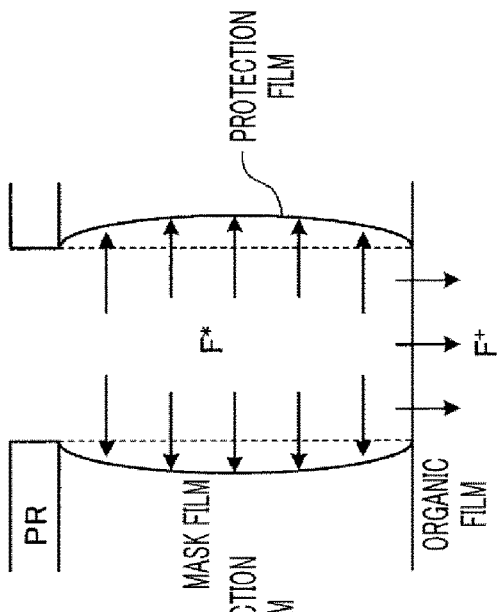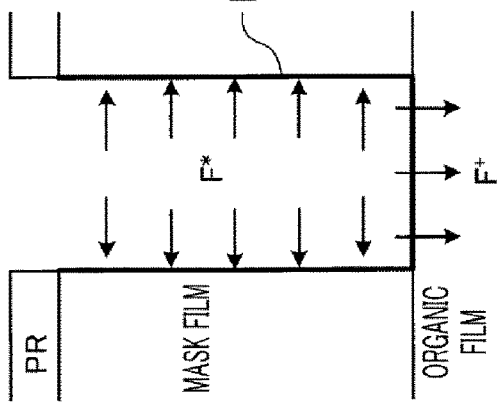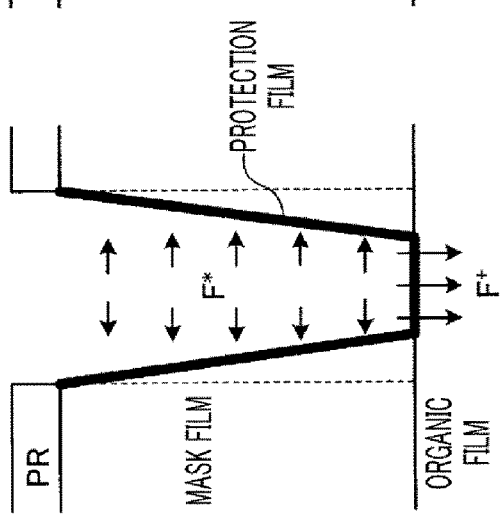

PLASMA PROCESSING METHOD

CROSS-REFERENCE TO RELATED APPLICATION

This Application is a U.S. national phase application under 35 U.S.C. § 371 of PCT Application No. PCT/JP2016/073648 filed on Aug. 10, 2016, which claims the benefit of Japanese Patent Application No. 2015-167416 filed on Aug. 27, 2015, the entire disclosures of which are incorporated herein by reference.

TECHNICAL FIELD

The various embodiments described herein pertain generally to a plasma processing method.

BACKGROUND ART

In a manufacturing process of a semiconductor device, a mask having a preset pattern is formed on an etching target layer, and the pattern of the mask is transcribed to the etching target layer by etching. For example, a resist mask formed by a photolithography technique is used as the mask. Accordingly, a limit size of the pattern formed on the etching target layer is affected by a resolution limit of the resist mask formed by the photolithography technique.

Along with the recent trend of miniaturization and high integration of semiconductor devices, a photolithography technique using an EUV (Extreme Ultra-Violet) light having a wavelength shorter than that of an ArF excimer laser beam is being considered. The photolithography using the EUV light enables forming a finer pattern on the resist mask, as compared to the photolithography using the ArF excimer laser beam. In the photolithography using the EUV light, a fine processing of, e.g., 10 nm or less can be performed.

With regard to the pattern formed on the resist mask, if a ratio of a height of the resist mask to a pattern size thereof is equal to or larger than 3, a problem such as a pattern collapse may be caused. In view of this, the ratio of the height of the resist mask to the pattern size thereof needs to be set to be equal to or less than 3. If the semiconductor device is miniaturized, the height of the resist mask is also thinned. The height of the resist mask becomes, for example, equal to or less than 30 nm in the generation of 10 nm.

When the etching target layer is etched, a part of the resist mask is also etched. If the height of the resist mask is thinned, however, the preset pattern of the resist mask cannot be maintained until the preset pattern is formed on the etching target layer. Accordingly, accuracy of a size of the pattern formed on the etching target layer after being etched may be degraded.

Described in Patent Document 1 is a technique of forming an encapsulation layer on a resist on a pattern and then performing an etching process for patterning a hard mask in order to improve etching resistance of an EUV photoresist. Further, in Patent Document 2, it is described that a wafer temperature is controlled to −40° C. to 0° C. only in a process of etching an organic antireflection film by using an ArF resist having a preset pattern as a mask in order to suppress a damage of the resist.

Patent Document 1: Japanese Patent Laid-open Publication No. 2013-145874

Patent Document 2: Japanese Patent Laid-open Publication No. 2005-072518

DISCLOSURE OF THE INVENTION

Problems to be Solved by the Invention

In case of etching the etching target layer with the photoresist as the mask, a modifying process for improving a surface roughness or the like of the photoresist having the preset pattern is performed before the etching of the etching target layer is performed. In the conventional modifying process, however, a thickness of the photoresist after the modifying process is finished becomes smaller than a thickness thereof before the modifying process is performed. Since finer processing can be performed in the photolithography using the EUV light than in the conventional photolithography using the ArF excimer laser beam, the photoresist needs to be thinner than in conventional cases. Thus, if the modifying process is performed on the photoresist having the pattern formed by the photolithography using the EUV light, the photoresist would become even thinner. Therefore, if the etching target layer is etched with this photoresist as the mask, the accuracy of the size of the etching target layer after being etched may be degraded.

Means for Solving the Problems

In an exemplary embodiment, there is provided a plasma processing method of processing a processing target object, in which an organic film, a mask film and a resist film are stacked in sequence, by plasma. The plasma processing method includes a process of supplying a modifying gas, which is a $H_2$ gas, a hydrogen halide gas, or a mixed gas containing a rare gas and a $H_2$ gas or a hydrogen halide gas, into a chamber accommodating therein the processing target object in which a preset pattern is formed on the resist film; and modifying process of modifying the resist film of the processing target object by plasma of the modifying gas at a processing temperature equal to or less than −20° C.

Effect of the Invention

According to the exemplary embodiment of the plasma processing apparatus, it is possible to maintain appropriate processing accuracy of a resist film itself.

BRIEF DESCRIPTION OF THE DRAWINGS

FIG. 11A to FIG. 11C are schematic diagrams showing an example of a relationship between a processing temperature and a cross sectional shape of a groove.

DETAILED DESCRIPTION

Hereinafter, a plasma processing method according to various exemplary embodiments will be explained in detail with reference to the accompanying drawings. However, it should be noted that the exemplary embodiments described herein are not meant to be anyway limiting. Further, the various exemplary embodiments can be appropriately combined as long as the contents of processes are not contradictory.

<First Exemplary Embodiment>
[Configuration of Plasma Processing Apparatus 100]

Figure 1:
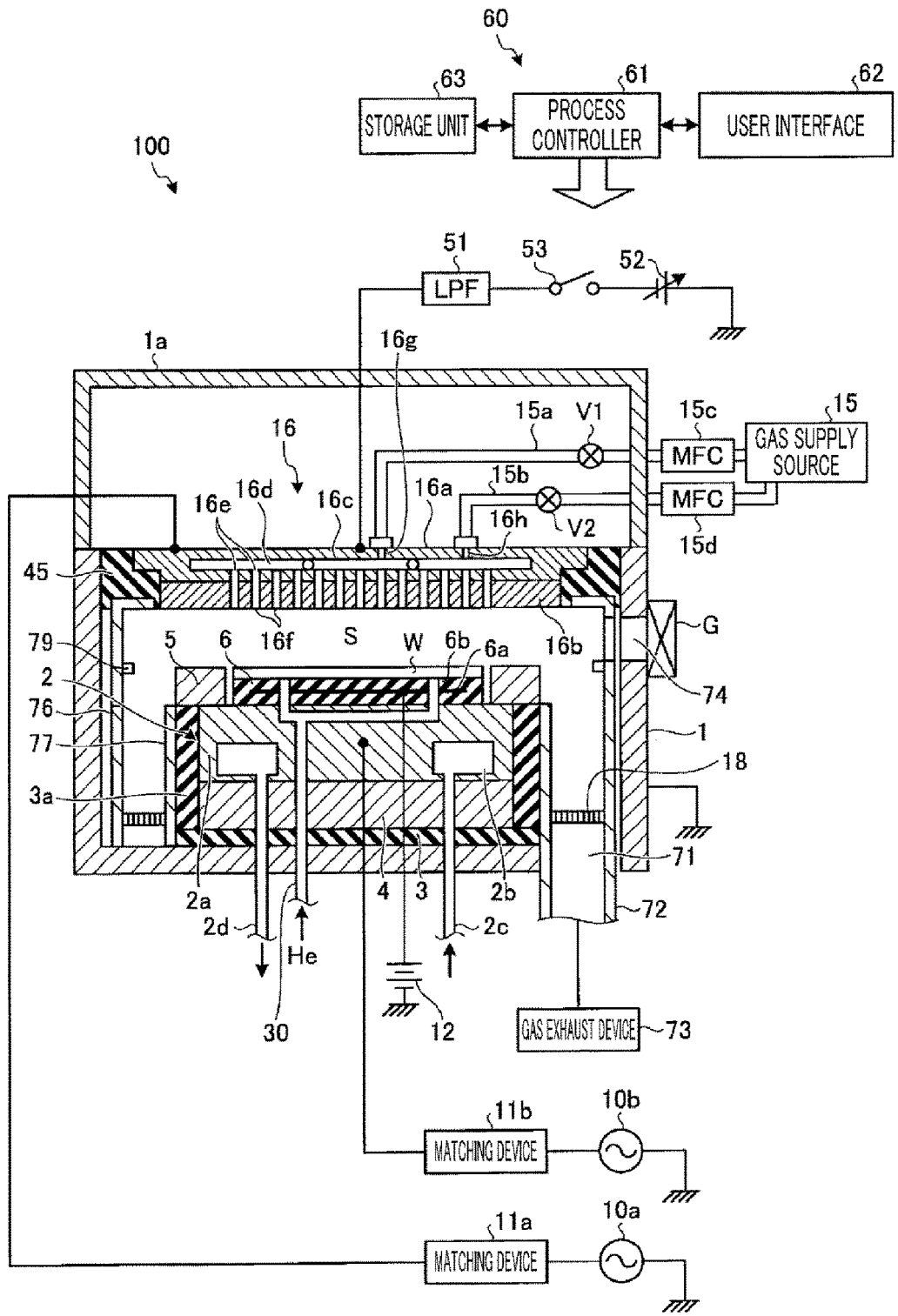
FIG. 1 is a cross sectional view illustrating an example of a plasma processing apparatus.

FIG. 1 is a cross sectional view illustrating an example of a plasma processing apparatus 100. The plasma processing apparatus 100 includes a chamber 1 which is hermetically sealed and electrically grounded. The chamber 1 has a substantially cylindrical shape and is made of, by way of example, aluminum having an anodically oxidized surface. A shower head 16 is provided at a top opening of the chamber 1, and a cylindrical grounding conductor 1a is provided above the shower head 16. A mounting table 2 configured to horizontally support thereon a semiconductor wafer W as an example of a processing target object is provided within the chamber 1.

The mounting table 2 includes a base 2a and an electrostatic chuck 6. The base 2a is made of a conductive metal such as, but not limited to, aluminum and serves as a lower electrode. The base 2a is supported on a supporting table 4 made of a conductor. The supporting table 4 is provided on a bottom portion of the chamber 1 with an insulating plate 3 therebetween. Further, a focus ring 5 made of, by way of non-limiting example, single crystalline silicon is provided on a periphery portion of a top surface of the mounting table 2. Further, a cylindrical inner wall member 3a made of, for example, quartz is provided to surround the mounting table 2 and the supporting table 4.

The electrostatic chuck 6 is provided on a top surface of the base 2a. The electrostatic chuck 6 includes an insulator 6b and an electrode 6a embedded in the insulator 6b. The electrode 6a is connected to a DC power supply 12. The electrostatic chuck 6 is configured to attract and hold the semiconductor wafer W on a top surface thereof by a Coulomb force which is generated on a surface of the electrostatic chuck 6 by a DC voltage applied to the electrode 6a from the DC power supply 12.

A path 2b through which a coolant flows is formed within the base 2a. The coolant such as Galden is circulated within the path 2b through pipelines 2c and 2d. The mounting table 2 and the electrostatic chuck 6 are controlled to have a preset temperature by the coolant which is circulated within the path 2b. Further, the mounting table 2 is equipped with a pipeline 30 which passes through the mounting table 2 and through which a heat transfer gas (backside gas) such as a helium gas is supplied to a rear surface of the semiconductor wafer W. The pipeline 30 is connected to a non-illustrated backside gas supply source. In the plasma processing apparatus 100, the semiconductor wafer W attracted to and held on the top surface of the electrostatic chuck 6 can be controlled to have a predetermine temperature by the coolant flowing within the path 2b and the heat transfer gas supplied to the rear surface of the semiconductor wafer W.

The shower head 16 is provided above the mounting table 2, facing the mounting table 2 substantially in parallel, i.e., facing the semiconductor wafer W mounted on the mounting table 2. The shower head 16 also serves as an upper electrode. That is, the shower head 16 and the mounting table 2 are configured as a pair of electrodes (an upper electrode and a lower electrode). A processing space S is provide between the semiconductor wafer W mounted on the mounting table 2 and the shower head 16. The shower head 16 is connected to a high frequency power supply 10a via a matching device 11a, and the base 2a of the mounting table 2 is connected to a high frequency power supply 10b via a matching device 11b.

The high frequency power supply 10a is configured to apply a high frequency power of a preset frequency (e.g., 60 MHz) for plasma generation to the shower head 16. Further, the high frequency power supply 10b is configured to apply, as a high frequency power having a predetermined frequency for ion attraction (bias), a high frequency power having a frequency (e.g., 13 MHz) lower than that of the high frequency power supply 10a to the base 2a of the mounting table 2.

The shower head 16 is supported at an upper portion of the chamber 1 with an insulating member 45 therebetween. The shower head 16 includes a main body 16a and an upper ceiling plate 16b. The main body 16a is formed of, by way of example, but not limitation, aluminum having an anodically oxidized surface and supports the upper ceiling plate 16b provided therebelow in a detachable manner. The upper ceiling plate 16b is made of a silicon-containing material such as, but not limited to, quartz.

Gas diffusion spaces 16c and 16d are formed within the main body 16a. Multiple gas through holes 16e are formed in a bottom portion of the main body 16a to be located under the gas diffusion spaces 16c and 16d. The gas diffusion space 16c is provided at a substantially central portion of the shower head 16, and the gas diffusion space 16d is provided in the vicinity of the gas diffusion space 16c to surround the gas diffusion space 16c. The gas diffusion spaces 16c and 16d are configured such that flow rates of a processing gas or the like therein can be controlled individually.

The upper ceiling plate 16b is provided with gas discharge holes 16f which are formed through the upper ceiling plate 16b in a thickness direction thereof. The gas discharge holes 16f respectively communicate with the gas through holes 16e. With this configuration, the processing gas supplied into the gas diffusion spaces 16c and 16d is introduced into the chamber 1 through the gas through holes 16e and the gas discharge holes 16f while being diffused in a shower shape. Further, the main body 16a or the like is equipped with a temperature control mechanism such as a non-illustrated heater or a non-illustrated pipeline for circulating the coolant, and a temperature of the shower head 16 can be controlled within a required temperature range while the semiconductor wafer W is being processed.

The main body 16*a* of the shower head 16 is also provided with a gas inlet opening 16*g* through which the processing gas is introduced into the gas diffusion space 16*c*; and a gas inlet opening 16*h* through which the processing gas is introduced into the gas diffusion space 16*d*. The gas inlet opening 16*g* is connected with one end of a pipeline 15*a*, and the other end of the pipeline 15*a* is connected via a valve V1 and a mass flow controller (MFC) 15*c* to a gas supply source 15 which is configured to supply the gas for the processing of the semiconductor wafer W. Further, the gas inlet opening 16*h* is connected with one end of a pipeline 15*b*, and the other end of the pipeline 15*b* is connected to the gas supply source 15 via a valve V2 and a MFC 15*d*.

The processing gas supplied from the gas supply source 15 is introduced into the gas diffusion spaces 16*c* and 16*d* through the pipelines 15*a* and 15*b* and is supplied into the chamber 1 through the gas through holes 16*e* and the gas discharge holes 16*f* while being diffused in the shower shape. By way of example, when performing a modifying process to be described later, the gas supply source 15 supplies a modifying gas into the chamber 1.

The shower head 16 is electrically connected to a variable DC power supply 52, which is configured to output a negative DC voltage, via a low pass filter (LPF) 51 and a switch 53. The switch 53 controls application and stop of the application of a DC voltage to the shower head 16 from the variable DC power supply 52. For example, when plasma is generated in the processing space S within the chamber 1 by applying the high frequency power from the high frequency power supply 10*a* to the shower head 16 and the high frequency power from the high frequency power supply 10*b* to the mounting table 2, the switch 53 is turned on, when necessary, so that a negative DC voltage having a preset magnitude is applied to the shower head 16 which serves as the upper electrode.

A gas exhaust path 71 is provided in the vicinity of the mounting table 2 to surround the mounting table 2. A baffle plate 18 having a multiple number of through holes is provided in the vicinity of the mounting table 2 between the processing space S and the gas exhaust path 71 to surround the mounting table 2. The gas exhaust path 71 is connected to a gas exhaust line 72, and the gas exhaust line 72 is connected to a gas exhaust device 73. The gas exhaust device 73 has a vacuum pump such as a turbo molecular pump. By operating this vacuum pump, the gas exhaust device 73 is capable of decompressing the inside of the chamber 1 to a predetermined vacuum level through the gas exhaust path 71 and the gas exhaust line 72.

An opening 74 is formed at a sidewall of the chamber 1, and a gate valve G configured to open/close the opening 74 is provided at the opening 74. Further, a deposition shield 76 and a deposition shield 77 are respectively provided along an inner wall of the chamber 1 and an outer surface of the mounting table 2 in a detachable manner. The deposition shields 76 and 77 are configured to suppress an etching byproduct (deposit) from adhering to the inner wall of the chamber 1. Further, a conductive member (GND block) 79, which is DC-connected to the ground, is provided at a position of the deposition shield 76 which is substantially on a level with the semiconductor wafer W attracted to and held on the electrostatic chuck 6. The GND block 79 is configured to suppress an abnormal discharge within the chamber 1.

An overall operation of the plasma processing apparatus 100 having the above-described configuration is controlled by a control unit 60. The control unit 60 is equipped with a process controller 61 which has a CPU (Central Processing Unit) and is configured to control the individual components of the plasma processing apparatus 100; a user interface 62; and a storage unit 63.

The user interface 62 includes an input device such as a keyboard through which an operator input commands or the like to operate the plasma processing apparatus 100; and an output device such as a display or the like configured to visually display an operational status of the plasma processing apparatus 100.

The storage unit 63 has stored thereon control programs (software) for implementing various processings performed in the plasma processing apparatus 100 under the control of the process controller 61; and recipes in which processing condition data and the like are recorded. The process controller 61 is operated based on the control programs stored in the storage unit 63 and reads out the recipes or the like from the storage unit 63 in response to an instruction from the user interface 62. The process controller 61 controls the plasma processing apparatus 100 according to the read-out recipes or the like, so that a required processing is performed in the plasma processing apparatus 100. Further, the process controller 61 may read out and execute control programs and recipes stored in a computer-readable recording medium (e.g., a hard disk, a CD, a flexible disk, a semiconductor memory, etc.), or may acquire control programs and recipes stored in a storage unit of another apparatus through, for example, a communication line and may execute them.

By way of example, the control unit 60 controls the individual components of the plasma processing apparatus 100 to perform a plasma processing method to be described later. As a detailed example, when performing the modifying process to be described later, the control unit 60 supplies the modifying gas into the chamber 1 and controls the semiconductor wafer W attracted to and held on the electrostatic chuck 6 to have a predetermined temperature. Then, by applying the high frequency power having a preset frequency and the negative DC voltage having a preset voltage level to the shower head 16 serving as the upper electrode and applying the high frequency power having a predetermined frequency to the mounting table 2 serving as the lower electrode, the control unit 60 generates plasma of the modifying gas within the chamber 1. Then, the control unit 60 modifies the photoresist on the semiconductor wafer W by the generated plasma of the modifying gas.

[Structure of Semiconductor Wafer W]

Figure 2:
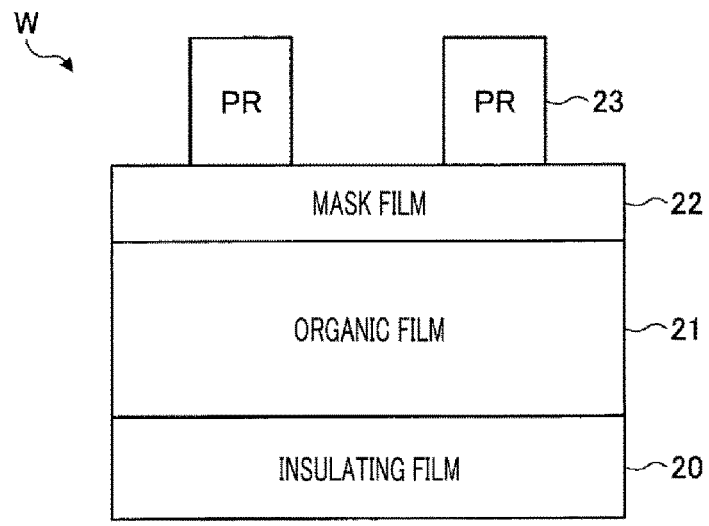
FIG. 2 is a cross sectional view illustrating an example of a semiconductor wafer.

The semiconductor wafer W processed in the present exemplary embodiment has a structure as shown in FIG. 2, for example. FIG. 2 is a cross sectional view illustrating an example of the semiconductor wafer W. The semiconductor wafer W is composed of an organic film 21, a mask film 22 and a photoresist (PR) 23 which are stacked on an insulating film 20 in this order. The insulating film 20 may be an oxide film such as, but not limited to, $SiO_2$. The organic film 21 may be an organic dielectric layer (ODL) such as, but not limited to, a spin-on carbon film. The mask film 22 may be, by way of example, a silicon-containing antireflection film (SiARC). Alternatively, the mask film 22 may have a double-layer structure in which a SiON film is stacked on the organic film 21 and an organic antireflection film (BARC) is stacked on the SiON film. The photoresist 23 may be, by way of non-limiting example, an EUV resist having a preset pattern formed by using an EUV light. The photoresist 23 is an example of a resist film.

[Plasma Processing]

Figure 3:
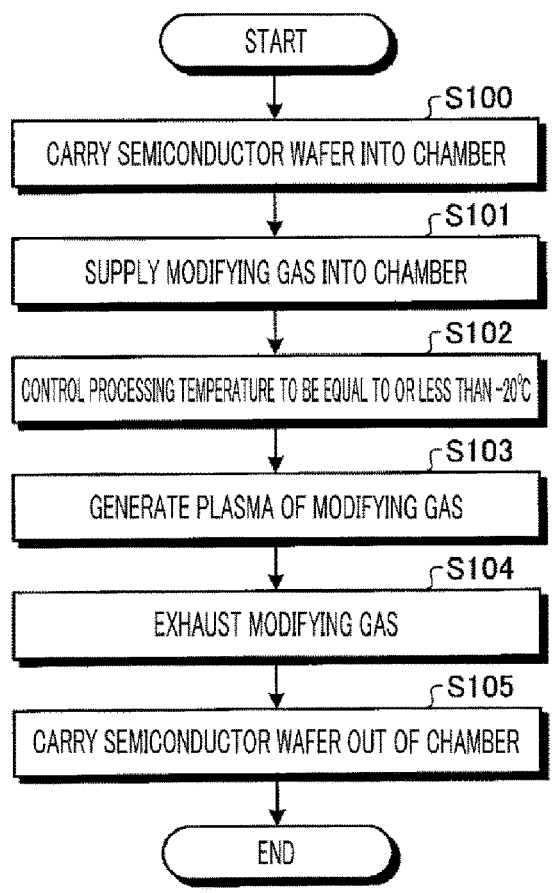
FIG. 3 is a flowchart for describing an example of a plasma processing method according to a first exemplary embodiment.

Now, a plasma processing performed on the semiconductor wafer W shown in FIG. 2 will be explained. FIG. 3 is a flowchart for describing an example of the plasma processing method according to the first exemplary embodiment.

First, in the plasma processing apparatus 100 shown in FIG. 1, after the gate valve G is opened, the semiconductor wafer W is carried into the chamber 1 through the opening 74 and placed on the electrostatic chuck 6 by a non-illustrated transfer robot or the like (S100). Then, the transfer robot is retreated out of the chamber 1, and the gate valve G is closed. Then, a preset DC voltage is applied from the DC power supply 12 to the electrode 6a of the electrostatic chuck 6, and the semiconductor wafer W is attracted to and held by the electrostatic chuck 6 by a Coulomb force. Then, the inside of the chamber 1 is evacuated to a predetermined vacuum level by the vacuum pump of the gas exhaust device 73.

After the inside of the chamber 1 reaches the predetermined vacuum level, the modifying gas is supplied into the chamber 1 from the gas supply source 15 at a preset flow rate, and the inside of the chamber 1 is maintained at a preset pressure (S101). In the present exemplary embodiment, the modifying gas is a hydrogen-containing gas. To be specific, the modifying gas is a mixed gas containing an Ar gas and a $H_2$ gas, for example. Further, the modifying gas may be a $H_2$ gas, a hydrogen halide gas, or a mixed gas containing a rare gas and a $H_2$ gas or a hydrogen halide gas. By way of non-limiting example, a HBr gas may be used as the hydrogen halide gas, and an Ar gas may be used as the rare gas.

The semiconductor wafer W is controlled to have a preset processing temperature by the coolant flowing in the path 2b of the mounting table 2 and the heat transfer gas supplied to the rear surface of the semiconductor wafer W (S102). In the process S102, the plasma processing apparatus 100 controls the processing temperature of the semiconductor wafer W to be, for example, equal to or less than −20° C. Desirably, in the process S102, the plasma processing apparatus 100 controls the processing temperature of the semiconductor wafer W within a range from, e.g., −60° C. to −20° C.

Then, the high frequency power having a preset frequency (e.g., 60 MHz) is applied to the shower head 16 from the high frequency power supply 10a, and the negative DC voltage having a preset voltage level is applied to the shower head 16 from the variable DC power supply 52. Further, the high frequency power having a predetermined frequency (e.g., 13 MHz) is applied to the mounting table 2 from the high frequency power supply 10b. As a result, an electric field is formed between the shower head 16 serving as the upper electrode and the mounting table 2 serving as the lower electrode, and plasma of the modifying gas is generated within the processing space S above the semiconductor wafer W (S103). The process S103 is an example of the modifying process. A surface of the photoresist 23 of the semiconductor wafer W is modified by the plasma of the modifying gas. Accordingly, a LWR (Line Width Roughness) and a LER (Line Edge Roughness) of the preset pattern formed on the photoresist 23 are improved.

After the processing is performed on the semiconductor wafer W by the plasma of the modifying gas for a preset time, the supply of the modifying gas from the gas supply source 15 is stopped, and the modifying gas within the chamber 1 is exhausted by the vacuum pump of the gas exhaust device 73 (S104). Then, after the gate valve G is opened, the semiconductor wafer W on the electrostatic chuck 6 is carried out of the chamber 1 by the transfer robot or the like (S105), and the plasma processing depicted in the present flowchart is ended. After the plasma processing described in the present flowchart is performed, a processing of etching the mask film 22 is performed on the semiconductor wafer W by using the photoresist 23 having the improved LWR and LER as a mask.

Figure 4:
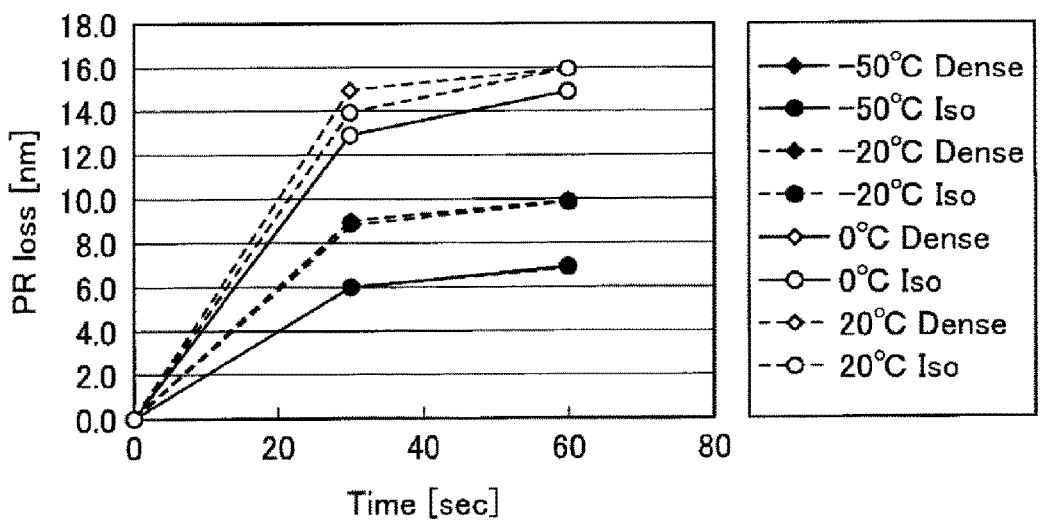
FIG. 4 is a diagram showing an example of a relationship between a processing temperature and a decrement of a height of a photoresist.

Here, depending on a temperature condition in the modifying process, a decrement of the height of the photoresist 23 may be increased as a result of performing the modifying process. FIG. 4 is a diagram showing an example of a relationship between a processing temperature and the height decrement of the photoresist. FIG. 4 shows an experiment result of the height decrement of the photoresist 23 at temperatures ranging from −50° C. to +20° C. with respect to a time during which the semiconductor wafer W is exposed to the plasma. Further, "Dense" shown in FIG. 4 indicates the height decrement of the photoresist 23 at a region thereof where a density of the pattern formed on the photoresist 23 is high, whereas "Iso" in FIG. 4 indicates the height decrement of the photoresist 23 at a region thereof where the density of the pattern formed on the photoresist 23 is low.

Referring to FIG. 4, in the modifying process, as the processing temperature of the semiconductor wafer W is decreased, the height decrement of the photoresist 23 is also decreased. That is, the height decrement of the photoresist 23 depends on the processing temperature of the semiconductor wafer W. Further, this tendency that the height decrement of the photoresist 23 gets smaller as the processing temperature of the semiconductor wafer W gets lower is commonly found both at the region where the density of the pattern formed on the photoresist 23 is high and the region where the density of the pattern formed on the photoresist 23 is low.

Figure 5:
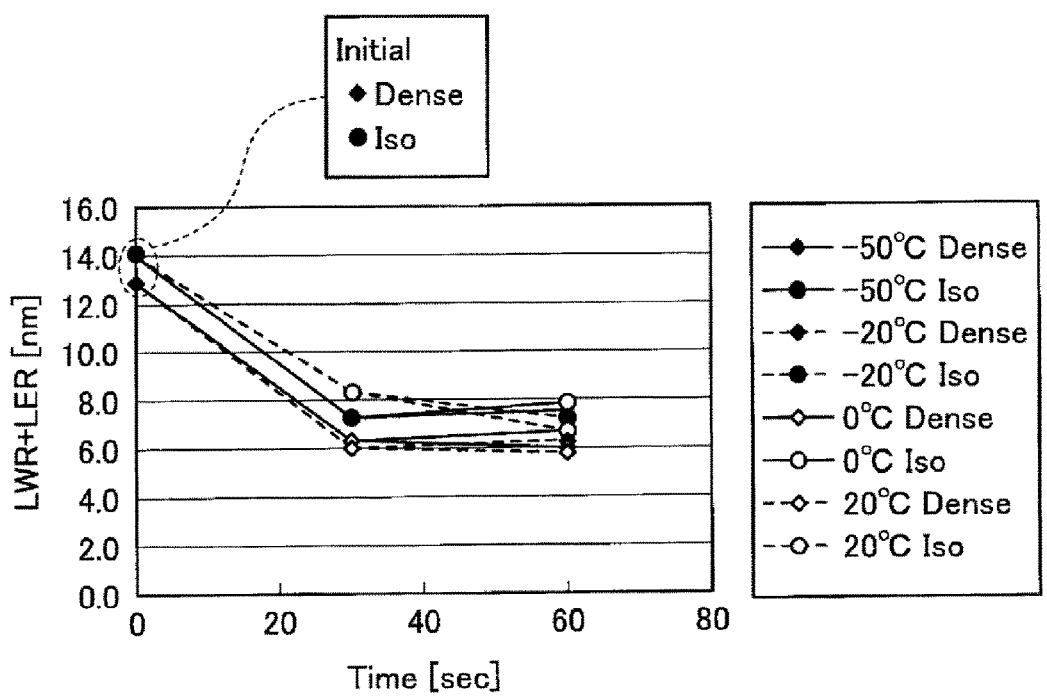
FIG. 5 is a diagram showing an example of a relationship of a sum of a LWR and a LER with respect to a processing temperature.

FIG. 5 is a diagram showing an example of a relationship of the sum of the LWR and the LER with respect to the processing temperature. FIG. 5 shows an experiment result of the sum of the LWR and the LER at the temperatures ranging from −50° C. to +20° C. with respect to the time during which the semiconductor wafer W is exposed to the plasma. Further, in FIG. 5, the sum of the LWR and the LER is measured at both the region where the density of the pattern formed on the photoresist 23 is high and the region where the density of the pattern formed on the photoresist 23 is low.

Referring to FIG. 5, in the modifying process, there is found a tendency that, if the time during which the semiconductor wafer W is exposed to the plasma is increased, the sum of the LWR and the LER is decreased, that is, the sum of the LWR and the LER is improved. Even if, however, the processing temperature of the semiconductor wafer W is changed, there is found no change in the sum of the LWR and the LER. That is, the improvement degree of the sum of the LWR and the LER depends on the time during which the semiconductor wafer W is exposed to the plasma but does not depend on the processing temperature of the semiconductor wafer W.

Figure 6:
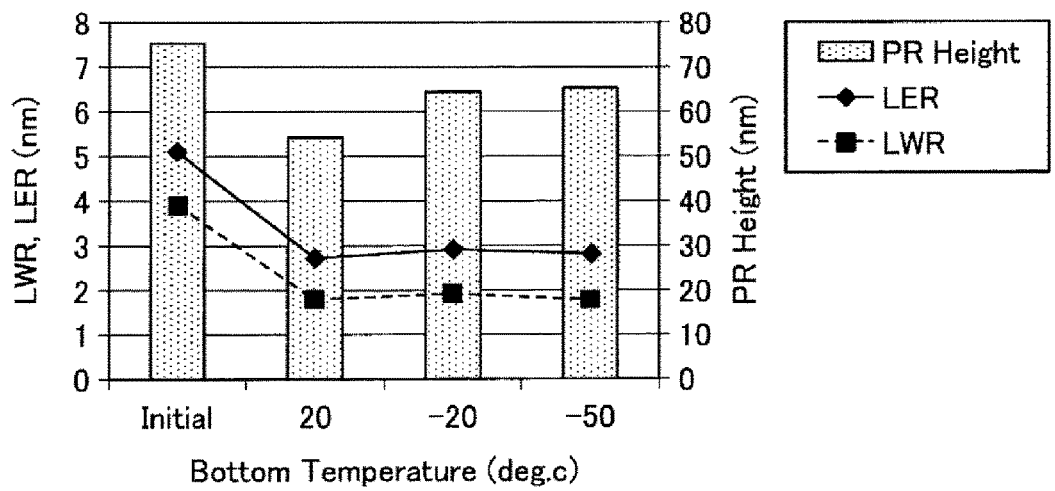
FIG. 6 is a diagram showing a relationship of a LWR, a LER and a height of the photoresist with respect to a processing temperature.

An example of a relationship of the LWR, the LER and the height of the photoresist with respect to the processing temperature is shown in FIG. 6. In FIG. 6, a first axis represents an example of a relationship of the LWR and the LER with respect to the processing temperature, and a second axis represents an example of a relationship of the height of the photoresist with respect to the processing temperature. Referring to FIG. 6, the LWR and LER values are found to be improved in the same manner even if the processing temperature of the semiconductor wafer W is changed.

Further, referring to FIG. 6, it is found out that the height decrement of the photoresist 23 is smaller when the processing temperature of the semiconductor wafer W is lower. In addition, there is no big difference in the height decrement of the photoresist 23 between two cases where the processing temperature of the semiconductor wafer W is −20° C. and −50° C. It may be deemed to be because a threshold value of activation energy of H radicals exists near −20° C. Accordingly, if the processing temperature of the semiconductor wafer W is set to be equal to or less than −20° C., the height decrement of the photoresist 23 can be reduced. Further, if the processing temperature of the semiconductor wafer W is set to be in the range from −60° C. to −20° C., an increase in a cost of the plasma processing can be suppressed as this temperature range is achievable by using a generally used coolant.

Here, in the modifying process, it may be deemed that the height of the photoresist 23 is decreased because of a spontaneous reaction by the H radicals existing in the plasma of the modifying gas. A rate constant k of the reaction by the H radicals can be calculated by the following expression (1) of Arrhenius Equation.

[Expression 1]

$$k = A\exp\left(-\frac{E_a}{RT}\right) \quad (1)$$

Here, A denotes a constant (frequency factor) irrelevant to temperature; $E_a$, activation energy per 1 mole; R, a gas constant; and T, an absolute temperature.

Figure 7:
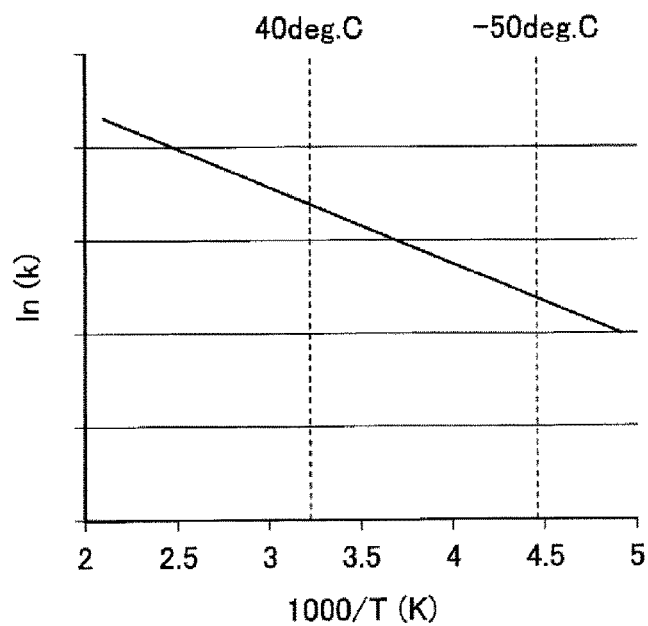
FIG. 7 is a diagram showing an example of an Arrhenius plot in a $H_2$ gas.

If a natural logarithm of the rate constant k is plotted with respect to a $H_2$ gas, a graph as shown in FIG. 7 is obtained, for example. FIG. 7 is a diagram showing an example of an Arrhenius plot in the $H_2$ gas. As can be clearly seen from FIG. 7, as the processing temperature is decreased, that is, as the value of 1000/T(K) is increased, the value of the rate constant k of the reaction by the H radicals is decreased, resulting in a reduction of the reaction rate. Accordingly, it may be believed that by lowering the processing temperature of the semiconductor wafer W, the rate of the spontaneous reaction by the H radicals existing in the plasma of the modifying gas is decreased, so that the decrease of the height of the photoresist 23 is suppressed.

Meanwhile, the LWR and the LER of the photoresist 23 are improved by an effect of a VUV (Vacuum Ultra-Violet) reaction. The photoresist 23 to which a VUV light is irradiated absorbs the VUV light, and a chemical reaction occurs on the surface of the photoresist 23 and the surface flows. Accordingly, the surface of the photoresist 23 becomes smooth, and irregularities of the surface, which is a cause of the LWR or the LER, are reduced. The VUV reaction depends on an emission intensity of the VUV light. The emission intensity I of the VUV light is defined by, for example, the following expression (2).

[Expression 2]

$$I(p,q) = \alpha\beta k_{ex}(p)n(1)n_e \quad (2)$$

Here, α and β denote proportionality constant; $k_{ex}(p)$, an excitation rate coefficient; n(1), a radical density; and $n_e$, an electron density.

As clearly seen from the above expression (2), the emission intensity I of the VUV light in the modifying process depends on the density of the H radicals but does not depend on the temperature. Thus, if conditions other than the processing temperature of the semiconductor wafer W are same, the same LWR and LER improvement effect as obtained in a room temperature or high temperature condition can be attained even in a low-temperature condition.

As stated above, by performing the modifying process in the low-temperature condition equal to or less than −20° C., it is possible to improve the LWR and the LER of the photoresist 23 by the VUV effect while suppressing the decrease of the height of the photoresist 23 by the H radicals. Accordingly, processing accuracy of the photoresist 23 can be maintained appropriately even after the modifying process is performed. Therefore, in the etching process in which the photoresist 23 modified in the modifying process is used as the mask, the processing accuracy of the etched semiconductor wafer W can be improved.

<Second Exemplary Embodiment>

In the first exemplary embodiment, the modifying process of modifying the photoresist 23 of the semiconductor wafer W by using the plasma of the modifying gas is performed. In the present exemplary embodiment, a first etching process of etching the mask film 22 with the photoresist 23 as a mask is additionally performed after the modifying process described in the first exemplary embodiment is performed. Further, since a configuration of a plasma processing apparatus 100 according to the second exemplary embodiment is the same as that of the plasma processing apparatus 100 according to the first exemplary embodiment shown in FIG. 1, detailed description thereof will be omitted.

[Plasma Processing]

Figure 8:
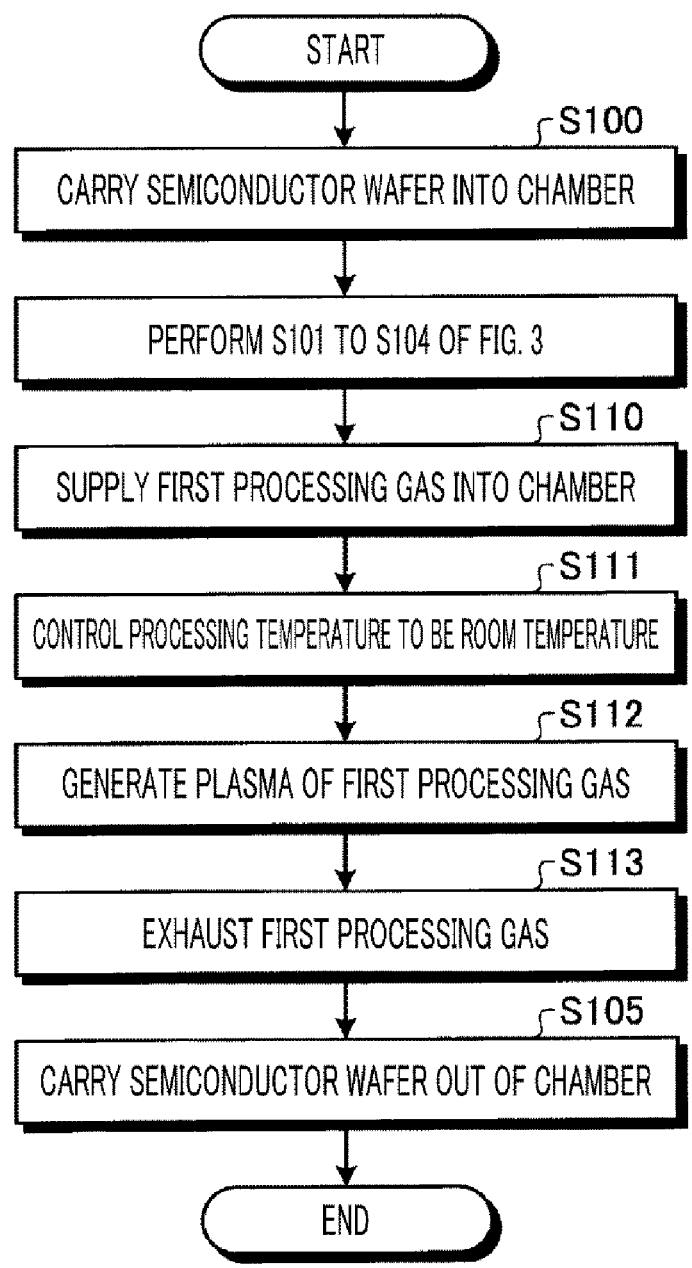
FIG. 8 is a flowchart for describing an example of a plasma processing method according to a second exemplary embodiment.

FIG. 8 is a flowchart for describing an example of a plasma processing method according to the second exemplary embodiment. In FIG. 8, processes assigned the same reference numerals as those in FIG. 3 are the same processes as described in FIG. 3, and detailed description thereof will be omitted.

First, in the plasma processing apparatus 100 shown in FIG. 1, the gate valve G is opened, and the semiconductor wafer W is placed on the electrostatic chuck 6, and then, attracted to and held by the electrostatic chuck 6 (S100). Then, the inside of the chamber 1 is evacuated to a predetermined vacuum level by the vacuum pump of the gas exhaust device 73. Thereafter, the processes S101 to S104 shown in FIG. 3 are performed.

Next, a first processing gas is supplied into the chamber 1 from the gas supply source 15 at a predetermined flow rate, and the inside of the chamber 1 is maintained at a preset pressure (S110). In the present exemplary embodiment, the first processing gas contains a $SF_6$ gas. Here, the first processing gas needs to contain, as a halogenated compound gas, a gas having a CF bond or a SF bond. For example, the first processing gas may contain a $CF_4$ gas, a $SF_6$ gas, or the like.

The semiconductor wafer W is controlled to have a predetermined processing temperature by the coolant flowing in the path 2b of the mounting table 2 and the heat transfer gas supplied to the rear surface of the semiconductor wafer W (S111). In the process S111, the plasma processing apparatus 100 controls the processing temperature of the semiconductor wafer W to a room temperature (e.g., within a range from 0° C. to 40° C.).

Subsequently, the high frequency power having a preset frequency (e.g., 60 MHz) is applied to the shower head 16 from the high frequency power supply 10a, and the negative DC voltage having a preset voltage level is applied to the shower head 16 from the variable DC power supply 52.

Further, the high frequency power having a predetermined frequency (e.g., 13 MHz) is applied to the mounting table 2 from the high frequency power supply 10*b*. As a result, an electric field is formed between the shower head 16 serving as the upper electrode and the mounting table 2 serving as the lower electrode, and plasma of the first processing gas is generated within the processing space S above the semiconductor wafer W (S112). The mask film 22 is etched by the plasma of the first processing gas with the photoresist 23 as the mask. The process S112 is an example of the first etching process.

After the etching of the mask film 22 is performed by the plasma of the first processing gas for a preset time, the supply of the first processing gas from the gas supply source 15 is stopped, and the first processing gas within the chamber 1 is exhausted by the vacuum pump of the gas exhaust device 73 (S113). Then, the gate valve G is opened, the semiconductor wafer W on the electrostatic chuck 6 is carried out of the chamber 1 (S105), and the plasma processing depicted in the present flowchart is ended. After the plasma processing described in the present flowchart is performed, a processing of etching the organic film 21 is performed on the semiconductor wafer W by using, as a mask, the mask film 22 to which the pattern of the photoresist 23 is transcribed by the etching.

Figure 9:
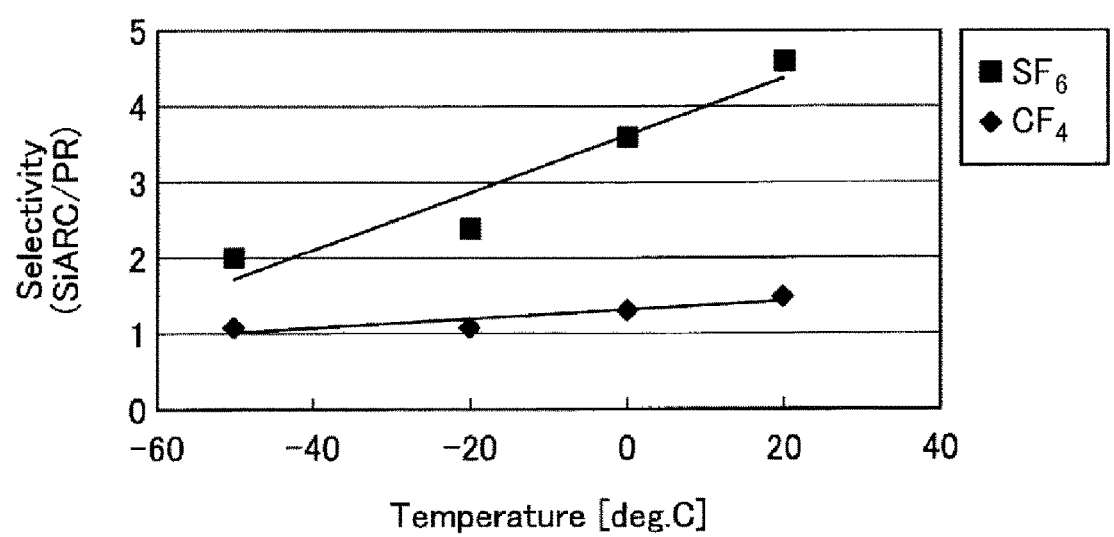
FIG. 9 is a diagram showing a relationship between a processing temperature and a selectivity.

Here, in the etching of the mask film 22 with the photoresist 23 as the mask, the first processing gas is used. In case of using the $SF_6$ or the $CF_4$ as the first processing gas, a selectivity of the mask film 22 with respect to the photoresist 23 is measured, and a result as shown in FIG. 9 is obtained, for example. FIG. 9 is a diagram showing an example of a relationship between the processing temperature and the selectivity. Referring to FIG. 9, the selectivity when using the $SF_6$ as the first processing gas is higher than the selectivity when using the $CF_4$ as the first processing gas. Further, a difference between the selectivity in case of using the $SF_6$ as the first processing gas and the selectivity in case of using the $CF_4$ as the first processing gas is further increased in the room temperature range (0° C. to 40° C.).

Here, a byproduct, which is generated as an element contained in the first processing gas and carbon contained in the photoresist 23 are bonded, is deposited on the photoresist 23 as a protection film, so that the selectivity of the mask film 22 with respect to the photoresist 23 is improved. Since bond energy of a C—S bond is 272 kJ/mol and bond energy of a C—C bond is 346 kJ/mol, the C—S bond is made with smaller energy than the C—C bond, so that the byproduct is generated. For this reason, when using the $SF_6$ as the first processing gas, the byproduct is more easily generated and the protection film is more easily formed on the photoresist 23. Accordingly, in case of using the $SF_6$ as the first processing gas, the selectivity becomes higher than that in case of using the $CF_4$ as the first processing gas.

Further, in the present exemplary embodiment, the mask film 22 is SiARC, or has the double-layer structure with BARC and SiON. Accordingly, a silicon element is contained in the mask film 22. While etching the mask film 22, a byproduct, which is generated as the element contained in the first processing gas and the silicon contained in the mask film 22 are bonded, is deposited on the photoresist 23 as a protection film. Thus, the selectivity of the mask film 22 with respect to the photoresist 23 is further improved.

Here, since bond energy of a Si—S bond is 293 kJ/mol and bond energy of a Si—C bond is 318 kJ/mol, the Si—S bond is made with smaller energy than the Si—C bond, so that the byproduct is generated. For this reason, when using the $SF_6$ as the first processing gas, the byproduct is more easily generated and the protection film is more easily formed on the photoresist 23. Accordingly, in case of using the $SF_6$ as the first processing gas, the selectivity becomes higher than that in case of using the $CF_4$ as the first processing gas.

Further, in case of using the $SF_6$ or the $CF_4$ as the first processing gas, F radicals (F*) and F ions (F$^+$) in the plasma all contribute to the plasma etching of the mask film 22. The byproduct, which is generated by the reaction with the carbon contained in the mask film 22, forms a protection film on a sidewall or a bottom surface of the mask film 22. Accordingly, the shape of the groove formed in the mask film 22 by the plasma etching is determined by correlation among the F ions contributing to downward-direction etching, the F radicals contributing to isotropic etching and the protection film.

Here, since bond energy of a S—F bond is 284 kJ/mol and bond energy of a C—F bond is 485 kJ/mol, an absolute amount of the F radicals in the plasma in case of using the $SF_6$ as the first processing gas is larger than an absolute amount of the F radicals in the plasma in case of using the $CF_4$ as the first processing gas. Thus, in case of using the $SF_6$ as the first processing gas, the isotropic etching by the F radicals is accelerated more than in case of using the $CF_4$ as the first processing gas.

Figure 10:
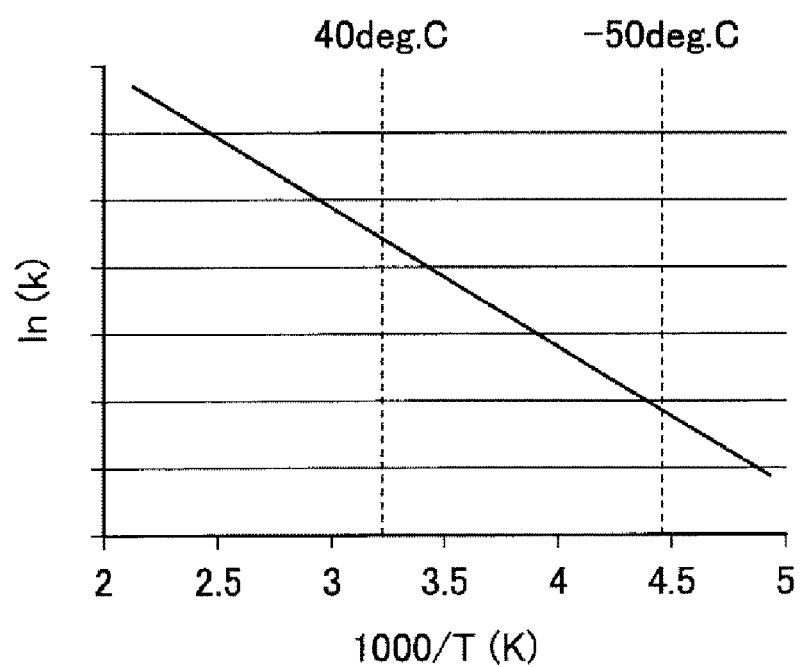
FIG. 10 is a diagram showing an example of an Arrhenius plot in fluorine.

FIG. 10 is a diagram showing an Arrhenius plot in fluorine. For example, as shown in FIG. 10, the rate constant k of the reaction by the fluorine is increased as the processing temperature is increased, that is, as the value of 1000/T(K) is decreased, so that the reaction rate is increased. Meanwhile, as the processing temperature is lowered, that is, as the value of 1000/T(K) is increased, the rate constant k of the reaction is decreased, so that the reaction rate is reduced.

FIG. 11A to FIG. 11C are schematic diagrams illustrating an example of a relationship between the processing temperature and the cross sectional shape of the groove. FIG. 11A shows an example of the cross sectional shape of the groove formed in the mask film 22 in case that the etching is performed at a low processing temperature (e.g., less than 0° C.). FIG. 11B illustrates an example of the cross sectional shape of the groove formed in the mask film 22 in case that the etching is performed at a room temperature (e.g., equal to or higher than 0° C. and less than 40° C.). FIG. 11C shows an example of the cross sectional shape of the groove formed in the mask film 22 in case that the etching is performed at a high processing temperature (e.g., equal to or higher than 40° C.).

According to the Arrhenius plot shown in FIG. 10, in case that the processing temperature is low, the spontaneous reaction by the F radicals is suppressed. Accordingly, formation of the protection film on the sidewall becomes dominant. Thus, as shown in FIG. 11A, for example, the sidewall of the groove formed in the mask film 22 becomes to have a tapered shape, and a bottom of the groove is closed by the protection film so that the etching is stopped.

Meanwhile, according to the Arrhenius plot shown in FIG. 10, in case that the processing temperature is high, the spontaneous reaction by the F radicals is accelerated. Accordingly, the isotropic etching by the F radicals becomes dominant. Thus, as shown in FIG. 11C, for example, the shape of the groove formed in the mask film 22 becomes to have a bowing shape.

Further, in case that the processing temperature is the room temperature, the protection film formed at the sidewall of the groove and the isotropic etching by the F radicals are well balanced, the sidewall of the groove formed in the mask film 22 is nearly vertical, as shown in FIG. 11B.

Figure 12:
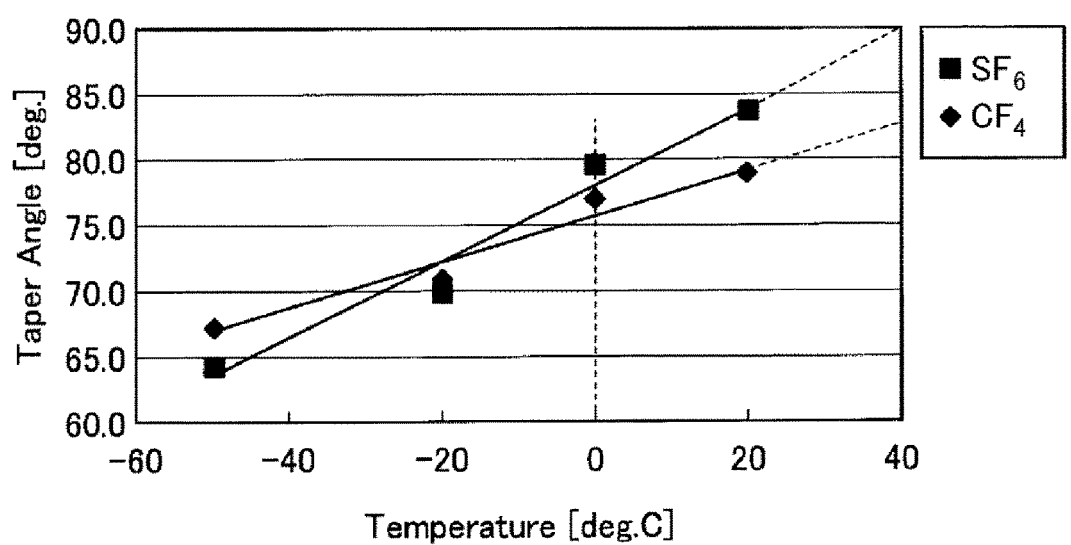
FIG. 12 is a diagram showing an example of a relationship between a processing temperature and a taper angle.

FIG. 12 is a diagram showing an example of a relationship between the processing temperature and a taper angle. Referring to FIG. 12, in case of using the $SF_6$ or the $CF_4$ as the first processing gas, the angle of the sidewall of the groove increases with a rise of the processing temperature. In case of using the $SF_6$ as the first processing gas, the taper angle becomes equal to or larger than 80 degrees when the processing temperature becomes equal to or higher than about 0° C. Further, referring to FIG. 12, in case of using the $SF_6$ as the first processing gas, in view of the tendency of the increase of the taper angle with respect to the increase of the processing temperature, the taper angle becomes 90 degrees when the processing temperature reaches about 40° C.

Here, it is desirable that the sidewall of the groove formed in the mask film 22 has an angle within a range from 80 degrees to 90 degrees. Thus, in case of using the $SF_6$ as the first processing gas, the taper angle of the sidewall of the groove falls within the range from 80 degrees to 90 degrees when the processing temperature is within the range from 0° C. to 40° C. Accordingly, in the first etching process of etching the mask film 22, it is desirable that the processing temperature is within the range from 00 to 40° C. in case of using the $SF_6$ as the first processing gas.

Furthermore, referring to FIG. 12, even in case of using the $CF_4$ as the first processing gas, the taper angle of the sidewall of the groove falls within the range from 80 degrees to 90 degrees when the processing temperature is in a range from 20° C. to 40° C. Thus, it is desirable that the processing temperature is within the range from 20° C. to 40° C. in case of using the $CF_4$ as the first processing gas in the first etching process of etching the mask film 22.

<Third Exemplary Embodiment>

In the second exemplary embodiment, after the modifying process of modifying the photoresist 23 of the semiconductor wafer W by using the plasma of the modifying gas, the first etching process of etching the mask film 22 of the semiconductor wafer W with the photoresist 23 as the mask is performed. In the present exemplary embodiment, after the modifying process and the first etching process described in the second exemplary embodiment are performed, a second etching process of etching the organic film 21 of the semiconductor wafer W with the mask film 22, which is etched in the first etching process, as a mask is additionally performed. Furthermore, in the present exemplary embodiment, since a configuration of a plasma processing apparatus 100 is the same as that of the plasma processing apparatus 100 in the first exemplary embodiment shown in FIG. 1, detailed description thereof is omitted.

[Plasma Processing]

Figure 13:
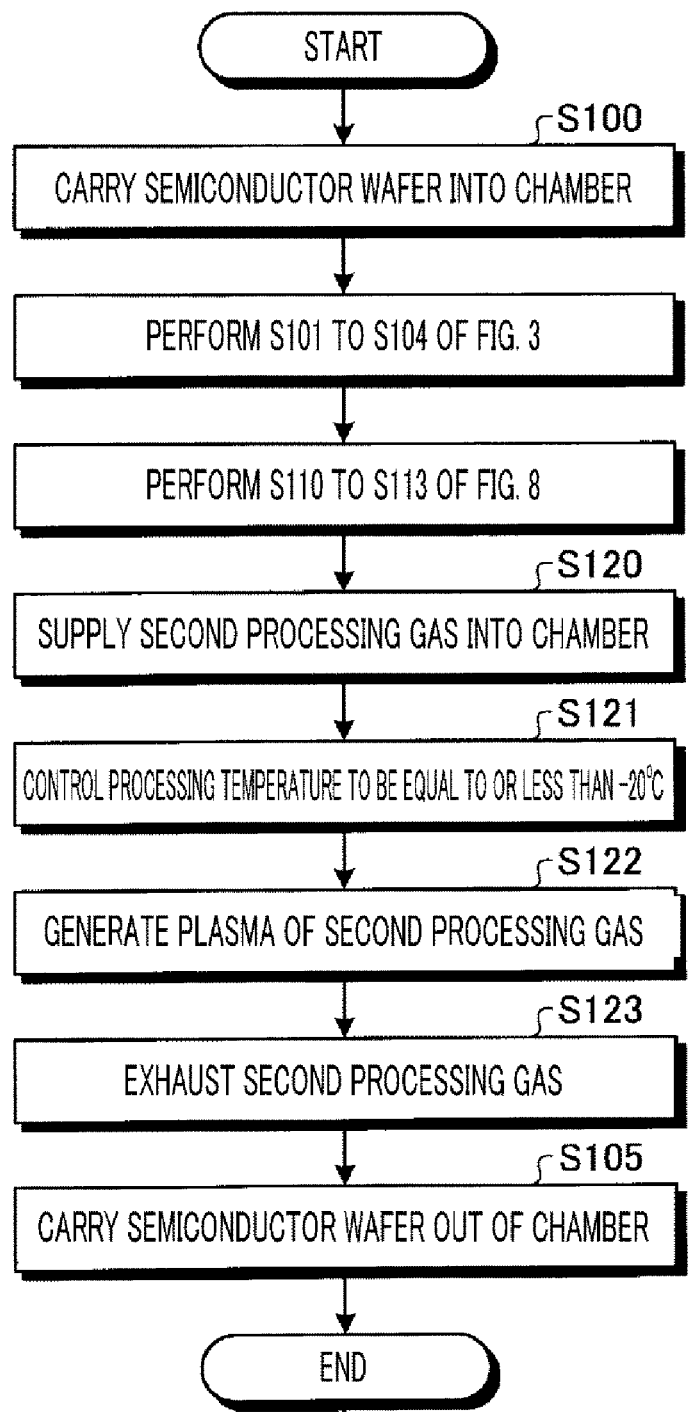
FIG. 13 is a flowchart for describing an example of a plasma processing method according to a third exemplary embodiment.

FIG. 13 is a flowchart for describing an example of a plasma processing method according to the third exemplary embodiment. In FIG. 13, processes assigned the same reference numerals as those in FIG. 3 are the same processes as described in FIG. 3, and detailed description thereof will be omitted.

First, in the plasma processing apparatus 100 shown in FIG. 1, the gate valve G is opened, and the semiconductor wafer W is placed on the electrostatic chuck 6, and then, attracted to and held by the electrostatic chuck 6 (S100). Then, the inside of the chamber 1 is evacuated to a predetermined vacuum level by the vacuum pump of the gas exhaust device 73.

Next, the processes S101 to S104 shown in FIG. 3 are performed. Accordingly, the photoresist 23 is modified, and the LWR and the LER of the photoresist 23 are decreased.

Then, the processes S110 to S113 shown in FIG. 8 are performed. Accordingly, the pattern of the photoresist 23 having the decreased LWR and LER is transcribed to the mask film 22.

Thereafter, a second processing gas is supplied into the chamber 1 from the gas supply source 15 at a preset flow rate, and the inside of the chamber 1 is maintained at a predetermined pressure (S120). In the present exemplary embodiment, the second processing gas is a mixed gas of an Ar gas and an $O_2$ gas. Here, the second processing gas needs to be a mixed gas, which contains a rare gas and a gas containing oxygen atoms. As the rare gas, an Ar gas or the like may be used, for example. Further, besides the $O_2$ gas, a $CO_2$ gas or the like may be used as the gas containing oxygen atoms.

The semiconductor wafer W is controlled to have a predetermined processing temperature by the coolant flowing in the path 2b of the mounting table 2 and the heat transfer gas supplied to the rear surface of the semiconductor wafer W (S121). In the process S121, the plasma processing apparatus 100 controls the processing temperature of the semiconductor wafer W to be, e.g., equal to or less than −20° C. Desirably, in the process S121, the plasma processing apparatus 100 controls the processing temperature of the semiconductor wafer W to a range from, e.g., −60° C. to −20° C.

Next, the high frequency power having a preset frequency (e.g., 60 MHz) is applied to the shower head 16 from the high frequency power supply 10a, and the negative DC voltage having a preset voltage level is applied to the shower head 16 from the variable DC power supply 52. Further, the high frequency power having a predetermined frequency (e.g., 13 MHz) is applied to the mounting table 2 from the high frequency power supply 10b. As a result, an electric field is formed between the shower head 16 serving as the upper electrode and the mounting table 2 serving as the lower electrode, and plasma of the second processing gas is generated within the processing space S above the semiconductor wafer W (S122). The organic film 21 is etched by the plasma of the second processing gas with, as a mask, the mask film 22 to which the pattern of the photoresist 23 is transcribed. The process S122 is an example of the second etching process.

After the etching of the organic film 21 is performed by the plasma of the second processing gas for a preset time, the supply of the second processing gas from the gas supply source 15 is stopped, and the second processing gas within the chamber 1 is exhausted by the vacuum pump of the gas exhaust device 73 (S123). Then, the gate valve G is opened, the semiconductor wafer W on the electrostatic chuck 6 is carried out of the chamber 1 (S105), and the plasma processing depicted in the present flowchart is ended. After the plasma processing described in the present flowchart is performed, a processing of etching the insulating film 20 is performed on the semiconductor wafer W with, as a mask, the organic film 21 to which the pattern of the mask film 22 is transcribed by the etching.

Figure 14:
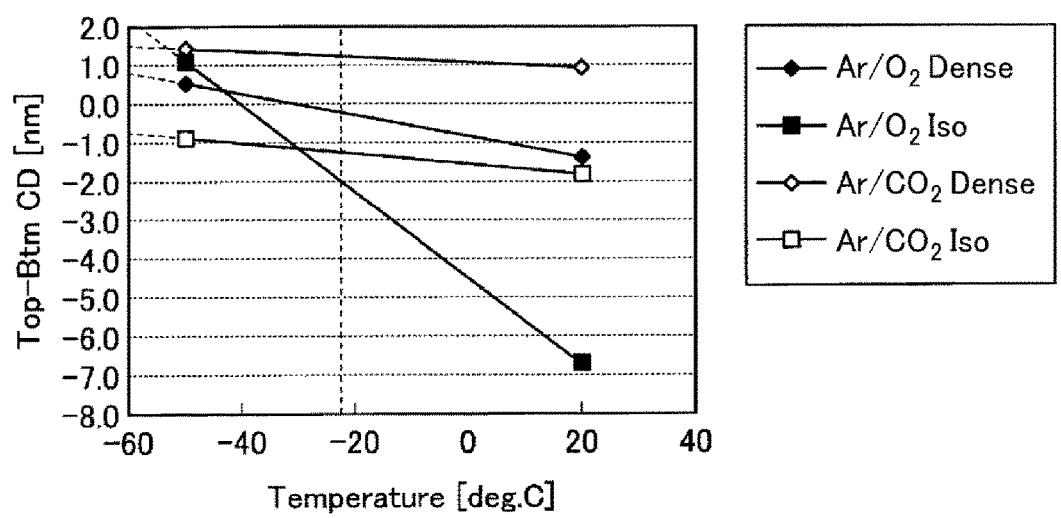
FIG. 14 is a diagram showing an example of a relationship between a processing temperature and a Top-Btm CD.

Here, in the etching of the organic film 21 with the mask film 22 as the mask, the second processing gas is used. In case of using the mixed gas of the Ar gas and the $O_2$ gas as the second processing gas, a value of a Top-Btm CD is increased as the processing temperature of the semiconductor wafer W is decreased, as shown in FIG. 14, for example. FIG. 14 is a diagram showing an example of a relationship between the processing temperature and the Top-Btm CD. In FIG. 14, a vertical axis represents the value of the Top-Btm CD, and a horizontal axis indicates the processing temperature of the semiconductor wafer W.

Further, the Top-Btm CD is a value calculated by subtracting a Btm CD from a Top CD. The Top CD is a CD (Critical Dimension) of an opening of a groove formed in the organic film 21, and the Btm CD is a CD of a bottom of the groove formed in the organic film 21. Further, "Dense" shown in FIG. 14 indicates the Top-Btm CD of the groove formed in a region of the organic film 21 where a density of the groove is high, whereas "Iso" in FIG. 14 indicates a Top-Btm CD of the groove formed in a region of the organic film 21 where the density of the groove is low.

Further, in case that the Top-Btm CD has a value larger than zero (0), a sidewall of the groove formed in the organic film 21 has a tapered shape. Further, in case that the Top-Btm CD has a value smaller than zero, the sidewall of the groove formed in the organic film 21 has a bowing shape. Furthermore, in case that the Top-Btm CD has a value of zero, the sidewall of the groove formed in the organic film 21 is substantially vertical.

Referring to FIG. 14, in case of using the mixed gas of the Ar gas and the $O_2$ gas as the second processing gas, the Top-Btm CD value is increased in a minus direction as the processing temperature of the semiconductor wafer W is increased. That is, with the rise of the processing temperature of the semiconductor wafer W, the groove formed in the organic film 21 becomes to have the bowing shape. Meanwhile, as the processing temperature of the semiconductor wafer W is decreased, the Top-Btm CD value approaches zero (0). That is, with the decrease of the processing temperature of the semiconductor wafer W, the bowing shape of the groove formed in the organic film 21 is suppressed.

Further, as depicted in FIG. 14, in case of using the mixed gas of the Ar gas and the $CO_2$ gas as the second processing gas as well, as the processing temperature of the semiconductor wafer W is decreased, the Top-Btm CD value becomes close to zero. That is, as the processing temperature of the semiconductor wafer W is decreased, the bowing shape of the groove formed in the organic film 21 is suppressed. Thus, in case of using the mixed gas of the Ar gas and the $CO_2$ gas as the second processing gas as well, by setting the processing temperature of the semiconductor wafer W to be low, the bowing shape of the groove formed in the organic film 21 can be suppressed.

Figure 15:
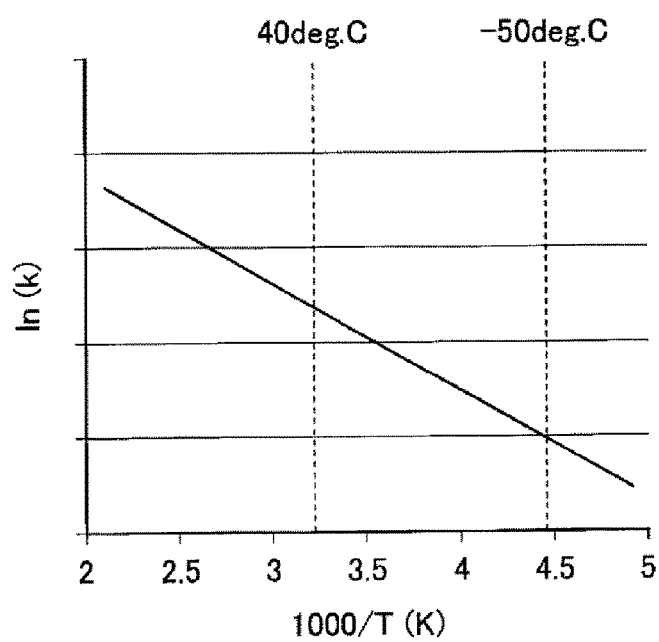
FIG. 15 is a diagram showing an example of an Arrhenius plot in an $O_2$ gas.

FIG. 15 is a diagram showing an example of an Arrhenius plot in $O_2$ gas. For example, as shown in FIG. 15, if the processing temperature is increased, that is, if the value of 1000/T(K) is lowered, the rate constant k of the reaction by O radicals or the like is increased, so that the reaction rate is increased. That is, as the processing temperature is increased, the reaction rate of the O radicals contributing to the isotropic etching is increased. As a result, the spontaneous reaction of the sidewall of the groove formed in the organic film 21 is accelerated, so that the groove has the bowing shape.

Meanwhile, as depicted in FIG. 15, for example, if the processing temperature is decreased, that is, if the value of 1000/T(K) is increased, the rate constant k of the reaction by the O radicals or the like is decreased, resulting in the decrease of the reaction rate. That is, as the processing temperature is decreased, the reaction rate of the O radicals contributing to the isotropic etching is decreased. Thus, the spontaneous reaction of the sidewall of the groove formed in the organic film 21 is suppressed, so that the bowing shape of the groove is suppressed. Accordingly, in the etching of the organic film 21 with the mask film 22 as a mask, the bowing shape of the groove formed in the organic film 21 can be suppressed by setting the processing temperature of the semiconductor wafer W to be low.

Further, referring to FIG. 14, if the processing temperature of the semiconductor wafer W is equal to or less than about −20° C., the Top-Btm CD value becomes equal to or larger than −2.0 nm in any condition, so that the bowing shape of the groove is suppressed sufficiently. Therefore, in the etching of the organic film 21 with the mask film 22 as the mask, when using the mixed gas of the Ar gas and the $O_2$ gas or the mixed gas of the Ar gas and the $CO_2$ gas as the second processing gas, it is desirable that the processing temperature of the semiconductor wafer W is set to be equal to or less than −20° C.

Moreover, as can be seen from FIG. 14, if the processing temperature of the semiconductor wafer W is equal to or less than about −60° C., the Top-Btm CD value of "Iso" becomes equal to or larger than +2.0 nm in case of using the mixed gas of the Ar gas and the $O_2$ gas as the second processing gas. If the Top-Btm CD value is increased excessively in a plus direction, the sidewall of the groove formed in the organic film 21 becomes to have a tapered shape and the bottom of the groove is closed, so that the etching may be stopped. In view of this, in the etching of the organic film 21 with the mask film 22 as the mask, when using the mixed gas of the Ar gas and the $O_2$ gas or the mixed gas of the Ar gas and $CO_2$ gas as the second processing gas, it is desirable that the processing temperature of the semiconductor wafer W is set to be within the range from −60° C. to −20° C.

Figure 16:
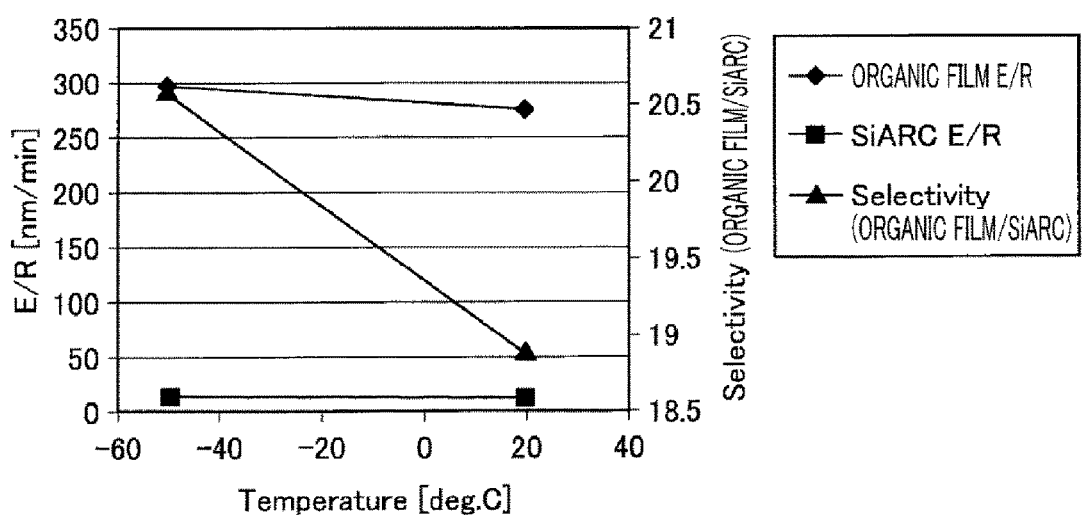
FIG. 16 is a diagram showing an example of a relationship between a processing temperature and a selectivity.

In addition, a relationship between the processing temperature and a selectivity of the organic film 21 with respect to the mask film 22 in case of using the mixed gas of the Ar gas and the $O_2$ gas as the second processing gas is as shown in FIG. 16, for example. FIG. 16 is a diagram illustrating an example of the relationship between the processing temperature and the selectivity. In FIG. 16, the SiARC is used as the mask film 22. By way of example, as depicted in FIG. 16, though an etching rate of the mask film 22 hardly depends on the processing temperature of the semiconductor wafer W, an etching rate of the organic film 21 is increased as the processing temperature of the semiconductor wafer W is decreased. Accordingly, as the processing temperature of the semiconductor wafer W is decreased, the selectivity of the organic film 21 with respect to the mask film 22 is increased. Therefore, in the etching of the organic film 21 with the mask 22 as the mask, by setting the processing temperature of the semiconductor wafer W to be low, it is possible to etch the organic film 21 with high selectivity.

<Fourth Exemplary Embodiment>

In the third exemplary embodiment, the modifying process, the first etching process and the second etching process are performed in the single plasma processing apparatus 100. The present exemplary embodiment is different from the third exemplary embodiment in that the modifying process and the second etching process are performed in a first plasma processing apparatus 100, whereas the first etching process is performed in a second plasma processing apparatus 100. Further, in the present exemplary embodiment, since configurations of the first plasma processing apparatus 100 and the second plasma processing apparatus 100 are the same as that of the plasma processing apparatus 100 in the first exemplary embodiment shown in FIG. 1, detailed description thereof will be omitted here.

[Plasma Processing]

Figure 17:
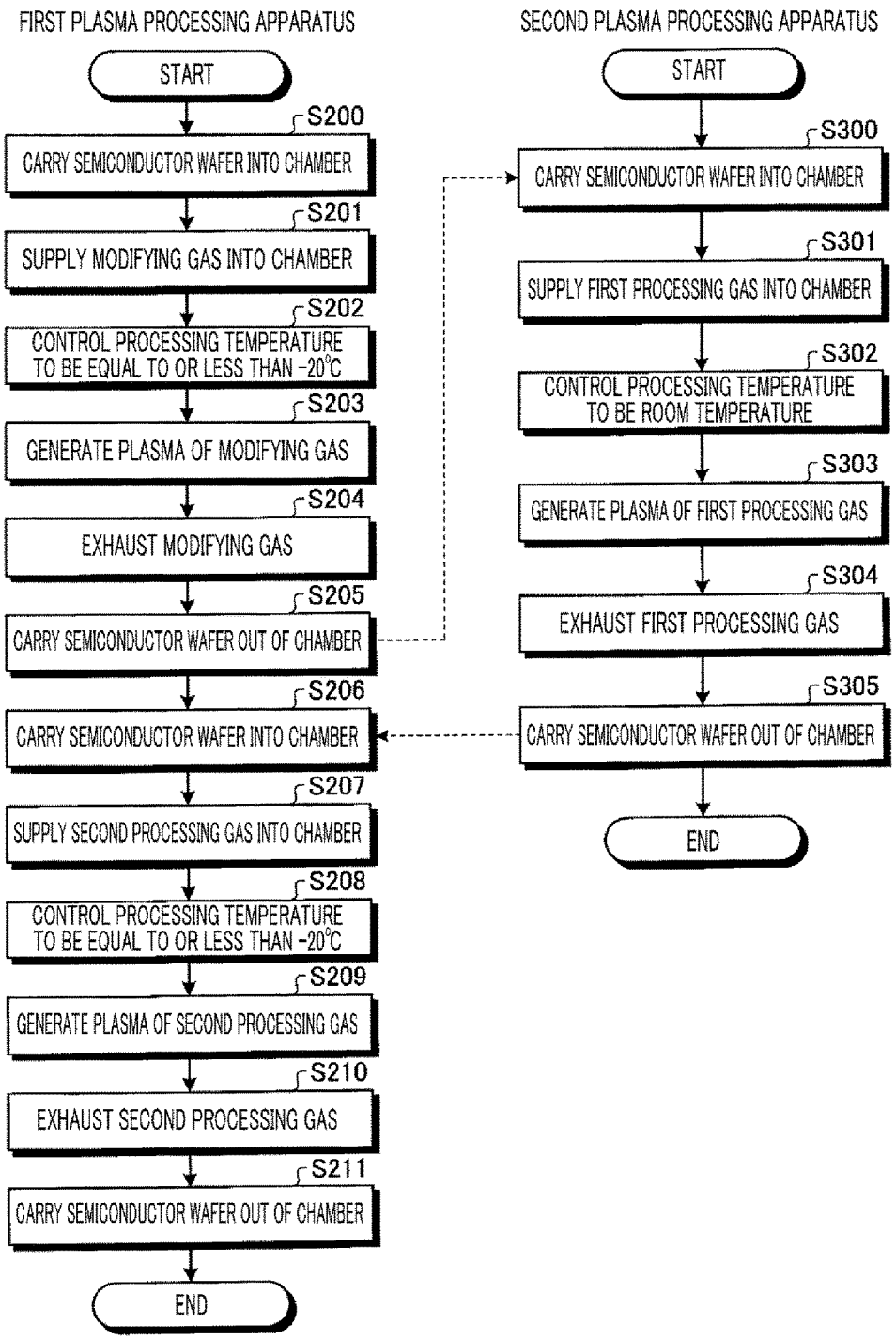
FIG. 17 is a flowchart for describing an example of a plasma processing method according to a fourth exemplary embodiment.

FIG. 17 is a flowchart for describing an example of a plasma processing method according to the fourth exemplary embodiment. First, in the first plasma processing apparatus 100, after the gate valve G is opened, the semiconductor wafer W is carried into the chamber 1 through the opening 74 by the transfer robot or the like to be placed on the electrostatic chuck 6 (S200). Then, the gate valve G is closed, and the semiconductor wafer W is attracted to and held by the electrostatic chuck 6. Then, the inside of the chamber 1 is evacuated to a predetermined vacuum level by the vacuum pump of the gas exhaust device 73.

After the inside of the chamber 1 of the first plasma processing apparatus 100 reaches the predetermined vacuum level, the modifying gas is supplied into the chamber 1 from the gas supply source 15 at a preset flow rate, and the inside of the chamber 1 is maintained at a preset pressure (S201). In the present exemplary embodiment, the modifying gas is a hydrogen-containing gas. To elaborate, the modifying gas contains, by way of non-limiting example, an Ar gas and a $H_2$ gas. Here, the modifying gas needs to be a $H_2$ gas, a hydrogen halide gas, or a mixed gas containing a rare gas and a $H_2$ gas or a hydrogen halide gas. The semiconductor wafer W is controlled to have a predetermined processing temperature by the coolant flowing in the path 2b of the mounting table 2 and the heat transfer gas supplied to the rear surface of the semiconductor wafer W (S202). In the process S202, the first plasma processing apparatus 100 controls the processing temperature of the semiconductor wafer W to be, e.g., equal to or less than −20° C. Desirably, in the process S202, the first plasma processing apparatus 100 controls the processing temperature of the semiconductor wafer W within a range from −60° C. to −20° C.

Next, the high frequency power having a preset frequency and the negative DC voltage having a preset voltage level are applied to the shower head 16, and the high frequency power having a predetermined frequency is applied to the mounting table 2. Accordingly, an electric field is generated between the shower head 16 serving as the upper electrode and the mounting table 2 serving as the lower electrode, and the plasma of the modifying gas is generated within the processing space S above the semiconductor wafer W (S203). The process S203 is an example of the modifying process. The surface of the photoresist 23 of the semiconductor wafer W is modified by the plasma of the modifying gas, and the LWR and the LER thereof are improved.

After the processing is performed on the semiconductor wafer W by the plasma of the modifying gas for a preset time, the supply of the modifying gas from the gas supply source 15 is stopped, and the modifying gas within the chamber 1 is exhausted by the vacuum pump of the gas exhaust device 73 (S204). Then, in the first plasma processing apparatus 100, the gate valve G is opened, and the semiconductor wafer W on the electrostatic chuck 6 is carried out of the chamber 1 by the transfer robot or the like (S205).

Thereafter, in the second plasma processing apparatus 100, the gate valve G is opened, and the semiconductor wafer W taken out from the first plasma processing apparatus 100 in the process S205 is carried into the chamber 1 of the second plasma processing apparatus 100 and mounted on the electrostatic chuck 6 by the transfer robot or the like (S300). Then, the gate valve G is closed, and the semiconductor wafer W is attracted to and held by the electrostatic chuck 6. Then, the inside of the chamber 1 is evacuated to a predetermined vacuum level by the vacuum pump of the gas exhaust device 73.

After the inside of the chamber 1 of the second plasma processing apparatus 100 reaches the predetermined vacuum level, the first processing gas is supplied into the chamber 1 from the gas supply source 15 at a preset flow rate, and the inside of the chamber 1 is maintained at a predetermined pressure (S301). In the present exemplary embodiment, the first processing gas contains a $SF_6$ gas. Here, the first processing gas needs to contain, as a halogenated compound gas, a gas having a CF bond or a SF bond. Then, the semiconductor wafer W is controlled to have a preset processing temperature by the coolant flowing in the path 2b of the mounting table 2 and the heat transfer gas supplied to the rear surface of the semiconductor wafer W (S302). In the process S302, the second plasma processing apparatus 100 controls the processing temperature of the semiconductor wafer W to a room temperature (e.g., a temperature within a range from 0° C. to 40° C.).

Next, the high frequency power having a preset frequency and the negative DC voltage having a preset voltage level are applied to the shower head 16, and the high frequency power having a predetermined frequency is applied to the mounting table 2. Accordingly, an electric field is generated between the shower head 16 serving as the upper electrode and the mounting table 2 serving as the lower electrode, and the plasma of the first processing gas is generated within the processing space S above the semiconductor wafer W (S303). The mask film 22 is etched by the plasma of the first processing gas with the photoresist 23 as a mask. The process S303 is an example of the first etching process.

After the etching of the mask film 22 by the plasma of the first processing gas is performed for a preset time, the supply of the first processing gas from the gas supply source 15 is stopped, and the first processing gas within the chamber 1 is exhausted by the vacuum pump of the gas exhaust device 73 (S304). Then, in the second plasma processing apparatus 100, the gate valve G is opened, and the semiconductor wafer W on the electrostatic chuck 6 is carried out of the chamber 1 (S305).

Thereafter, in the first plasma processing apparatus 100, the gate valve G is opened, and the semiconductor wafer W taken out from the second plasma processing apparatus 100 in the process S305 is carried into the chamber 1 of the first plasma processing apparatus 100 to be placed on the electrostatic chuck 6 by the transfer robot or the like (S206). Thereafter, the gate valve G is closed, and the semiconductor wafer W is attracted to and held by the electrostatic chuck 6. Then, the inside of the chamber 1 is evacuated to a predetermined vacuum level by the vacuum pump of the gas exhaust device 73.

After the inside of the chamber 1 of the first plasma processing apparatus 100 reaches the preset vacuum level, the second processing gas is supplied into the chamber 1 from the gas supply source 15 at a preset flow rate, and the inside of the chamber 1 is maintained at a predetermined pressure (S207). In the present exemplary embodiment, the second processing gas is a mixed gas of an Ar gas and an $O_2$ gas. Here, the second processing gas needs to be a mixed gas of a rare gas and a gas containing oxygen atoms. The semiconductor wafer W is controlled to have a predetermined processing temperature by the coolant flowing in the path 2b of the mounting table 2 and the heat transfer gas supplied to the rear surface of the semiconductor wafer W (S208). In the process S208, the first plasma processing apparatus 100 controls the processing temperature of the semiconductor wafer W to be, e.g., equal to or less than −20° C. Desirably, in the process S208, the first plasma processing apparatus 100 controls the processing temperature of the semiconductor wafer W within a range from, e.g., −60° C. to −20° C.

Subsequently, the high frequency power having a preset frequency and the negative DC voltage having a preset voltage level are applied to the shower head 16, and the high frequency power having a predetermined frequency is applied to the mounting table 2. Accordingly, an electric field is generated between the shower head 16 serving as the upper electrode and the mounting table 2 serving as the lower electrode, and the plasma of the second processing gas is generated within the processing space S above the semiconductor wafer W (S209). The organic film 21 is etched by the plasma of the second processing gas with the mask film 22 as a mask. The process S209 is an example of the second etching process.

After the etching of the organic film 21 by the plasma of the second processing gas is performed for a preset time, the supply of the second processing gas from the gas supply source 15 is stopped, and the second processing gas within the chamber 1 is exhausted by the vacuum pump of the gas exhaust device 73 (S210). Then, in the first plasma processing apparatus 100, the gate valve G is opened, and the semiconductor wafer W on the electrostatic chuck 6 is carried out of the chamber 1 (S211), and the plasma processing shown in the present flowchart is ended. After the plasma processing shown in the present flowchart is performed, a processing of etching the insulating film 20 is performed on the semiconductor wafer W with, as a mask, the organic film 21 to which the pattern of the mask film 22 is transcribed by the etching.

In the present exemplary embodiment, the first plasma processing apparatus 100 performs the modifying process (process S203) and the second etching process (process S209), and the second plasma processing apparatus 100 performs the first etching process. Further, the first plasma processing apparatus 100 controls the processing temperature of the semiconductor wafer W to be, e.g., equal to or less than −20° C. in the modifying process and the second etching process, and the second plasma processing apparatus 100 controls the processing temperature of the semiconductor wafer W to be, e.g., the room temperature in the first etching process.

Here, in case of performing the modifying process and the first etching process consecutively in the single plasma processing apparatus 100, it is required to wait for the semiconductor wafer W and the individual components within the chamber 1 to reach the room temperature before the first etching process is begun and after the modifying process is performed at the processing temperature equal to or less than −20° C. Further, in case of performing the first etching process and the second etching process in the single plasma processing apparatus 100 consecutively, it is required to wait for the semiconductor wafer W and the individual components of the chamber 1 to reach the temperature equal to or less than −20° C. before the second etching process is performed and after the first etching process is performed at the room temperature.

Meanwhile, according to the present exemplary embodiment, the modifying process and the second etching process performed at the temperature equal to or less than −20° C. are conducted in the first plasma processing apparatus 100, and the first etching process performed at the room temperature is conducted in the second plasma processing apparatus 100. Thus, the individual processes can be performed while maintaining the inside of the plasma processing apparatuses 100 at the predetermined temperatures. Therefore, the waiting time required for the individual components within the chamber 1 of each plasma processing apparatus 100 to reach the predetermined temperature can be shortened. Furthermore, when the modifying process, the first etching process and the second etching process are performed on multiple semiconductor wafers W consecutively, a throughput can be improved.

Further, in the plasma processing shown in FIG. 17, while the processes S200 to S205 are being performed in the first plasma processing apparatus 100, the second plasma processing apparatus 100 may perform the process S302 first. As a result, the first etching process can be begun more rapidly.

In the above, the various exemplary embodiments have been described. However, the exemplary embodiments are not limiting, and various changes and modifications may be made. For example, in the above-described exemplary embodiments, each plasma processing apparatus is configured as the capacitively coupled plasma processing apparatus. However, the inventive concept of the present disclosure may also be applicable to various other types of plasma processing apparatuses such as an inductively coupled plasma processing apparatus, a plasma processing apparatus using a microwave as a plasma source, and so forth. Furthermore, in each of the plasma processing apparatuses, the gas discharging units are provided in the form of the shower head. However, the gas discharging units may be provided in any forms as long as they are configured to supply the gas toward different zones within the processing vessel, i.e., multiple regions on the processing target object.

EXPLANATION OF REFERENCE NUMERALS

W: Semiconductor wafer
100: Plasma processing apparatus
1: Chamber
2: Mounting table
16: Shower head
20: Insulating film
21: Organic film
22: Mask film
23: Photoresist

We claim:
1. A plasma processing method of processing a processing target object, in which an organic film, a mask film and a resist film are stacked in sequence, by plasma, the plasma processing method comprising:
 a process of supplying a modifying gas, which is a $H_2$ gas, a hydrogen halide gas, or a mixed gas containing a rare gas and a $H_2$ gas or a hydrogen halide gas, into a chamber accommodating therein the processing target object in which a preset pattern is formed on the resist film;
 a modifying process of modifying the resist film of the processing target object by plasma of the modifying gas at a processing temperature equal to or less than −20° C.,
 a process of supplying a first processing gas for etching into the chamber; and
 a first etching process of etching the mask film with the resist film modified in the modifying process as a mask by plasma of the first processing gas at a processing temperature within a range from 0° C. to 40° C.

2. The plasma processing method of claim 1,
 wherein the first processing gas includes a gas containing a CF bond or a SF bond as a halogenated compound gas.

3. The plasma processing method of claim 1, further comprising:
 a process of supplying a second processing gas for etching into the chamber; and a second etching process of etching the organic film with the mask film etched in the first etching process as a mask by plasma of the second processing gas at the processing temperature equal to or less than −20° C.

4. The plasma processing method of claim 3, wherein the second processing gas contains a mixed gas of a rare gas and a gas containing oxygen atoms.

5. The plasma processing method of claim 1, further comprising:

a process of supplying a second processing gas for etching into the chamber; and a second etching process of etching the organic film with, as a mask, the mask film to which the pattern of the resist film modified in the modifying process is transcribed by plasma of the second processing gas at the processing temperature equal to or less than −20° C.

6. The plasma processing method of claim 1, wherein the modifying process and the first etching process are performed in a same plasma processing apparatus.

* * * * *

UNITED STATES PATENT AND TRADEMARK OFFICE
CERTIFICATE OF CORRECTION

| | | |
|---|---|---|
| PATENT NO. | : 10,460,963 B2 | Page 1 of 1 |
| APPLICATION NO. | : 15/747900 | |
| DATED | : October 29, 2019 | |
| INVENTOR(S) | : Shuhei Ogawa et al. | |

It is certified that error appears in the above-identified patent and that said Letters Patent is hereby corrected as shown below:

In the Specification

Column 13, Line 24, "00" should be -- 0°C --.

Signed and Sealed this
Twenty-fifth Day of February, 2020

Andrei Iancu
*Director of the United States Patent and Trademark Office*